United States Patent [19]
Arndt et al.

[11] Patent Number: 5,899,701
[45] Date of Patent: May 4, 1999

[54] METHOD FOR MAKING SILICA STRAIN TEST STRUCTURES

[75] Inventors: Russ Arndt, Wappingers Falls, N.Y.; Susan Cohen, Austin, Tex.; Ronald Hoyer, Dresden, Germany; Colleen Snavely, Hopewell Junction, N.Y.

[73] Assignees: Siemens Aktiengesellschaft, Munich, Germany; International Business Machines Corporation, Armonk, N.Y.

[21] Appl. No.: 08/882,056

[22] Filed: Jun. 25, 1997

[51] Int. Cl.⁶ .................................................. H01L 21/00
[52] U.S. Cl. .................................................. 438/12; 438/8
[58] Field of Search .................................. 438/14, 15, 16, 438/17, 18, 708, 12, 5, 8, 9; 34/78; 356/237.1

[56] References Cited

U.S. PATENT DOCUMENTS

| | | | |
|---|---|---|---|
| 5,757,479 | 5/1998 | Haga et al. | 356/237.1 |
| 5,815,942 | 12/1996 | Wu et al. | 34/78 |
| 5,851,925 | 7/1996 | Beh et al. | 438/708 |

OTHER PUBLICATIONS

Jin-Goo Park et al., "Effects of Drying and Wettability of Silicon on the Formation of Water Marks in Semiconductor Processing," Jun. 1995, *J. Electrochem. Soc.*, vol. 142, No. 6, pp. 2028–2031.

Scott Mackinnon, "Water-Spot Formation on Hydrophobic Silicon Surfaces," 1994, Microcontamination Conference Proceedings Sematech, pp. 173–184.

*Primary Examiner*—Charles Bowers
*Attorney, Agent, or Firm*—Stanton C. B raden

[57] ABSTRACT

A method for forming silica stain on a substrate to facilitate monitoring of the silica stain during integrated circuit manufacture. The method includes providing a silica stain test structure which has a silicon substrate, a hydrophilic silicon dioxide containing layer disposed above the silicon substrate, and a plurality of cavities formed in the silicon substrate through the silicon dioxide containing layer. The cavities have hydrophobic sidewalls. The method also includes exposing the silica stain test structure to deionized water, and drying the silica stain test structure to form the silica stain on the silicon dioxide containing layer.

14 Claims, 3 Drawing Sheets

_ _ _
METHOD FOR MAKING SILICA STRAIN TEST STRUCTURES

BACKGROUND OF THE INVENTION

The present invention relates to the manufacture of integrated circuits. More particularly, the present invention relates to wafer stain monitoring apparatus and methods therefor.

In the manufacture of semiconductor integrated circuits, the wafer may at times be processed using wet chemicals. For example, some process requires the appropriately patterned wafer to be immersed in wet, liquid chemicals for etching. After the exposed areas of wafer are etched by the wet chemicals, the wafer is then removed, washed with deionized water, and dried.

After washing and drying, it has been observed that silica stains sometimes appear on the surface of the wafer. The silica stains are caused by dissolved silica in the washing solution, which is redeposited on the surface of the wafer during drying. If a sufficiently thick layer of silica stain is left behind after washing and drying the wafer, the stain may affect subsequent processes. By way of example, the unwanted silica stains represent contaminants on the wafer, which may affect the electrical performance of the IC after fabrication. As another example, the silica stain may act as an unintended mask in a subsequent etch step. As can be appreciated by those skilled in the art, such silica stains are generally undesirable.

To monitor for the presence and amount of silica stain on the wafer surface, a silica test structure is usually needed. The silica stain test structure is designed to enhance the formation of silica stains, thereby rendering them more susceptible to detection and monitoring.

In the prior art, various silica stain test structures have been proposed. To facilitate discussion, FIG. 1 illustrates a prior art planar silicon stain test structure 100, which is typically formed atop a silicon wafer 102. Above silicon wafer 102, there is shown a plurality of silicon dioxide ($SiO_2$) strips 104. Silicon dioxide strips 104 are typically formed by first blanket depositing a layer of silicon dioxide above silicon wafer 102 and then etching back some of the silicon dioxide (using an appropriate photoresist mask and etchant) to form the strip pattern.

As the wafer containing silica stain test structure 100 is washed and dried, the alternating strips of silicon and silicon dioxide materials permit the silica-containing droplets of the wash solution to adhere to the surface of the test structure. When the droplets dry, the stain remains. The stain is depicted in FIG. 2 as stain 202 on silica stain test structure 100.

In FIG. 2, stain 202 is depicted as being fairly visible and hence detectable. In reality, prior art silica stain test structures (such as prior art silica stain test structure 100 of FIGS. 1 and 2) typically do not yield stains of sufficient sizes and thicknesses to be detectable by conventional (e.g., 10X–100X) optical microscopes. In the typical situation, it is necessary in the prior art to perform additional processing on the stains in order to facilitate stain detection and measurement. By way of example, one prior art stain monitoring technique requires that the stains formed on the prior art silica stain test structure be further etched via reactive ion etching (RIE) before it can be detected and/or measured. The presence and amount of stain may be ascertained by, for example, monitoring the RIE distortion.

As can be appreciated by those skilled in the art, the additional processing steps required to detect and/or measure stains formed on prior art silica monitor test structure are highly disadvantageous. At minimum, the additional processing represents an inconvenience to the process engineers, who must perform additional work before the presence and/or amount of silica stain can be detected. Additional processing also involves additional complexities, which can often be measured in terms of additional required time and/or expenses.

In view of the foregoing, there are desired improved silica stain monitoring techniques.

SUMMARY OF THE INVENTION

The invention relates, in one embodiment, to a method for forming silica stain on a substrate to facilitate monitoring of the silica stain during integrated circuit manufacture. The method includes providing a silica stain test structure which has a silicon substrate, a hydrophilic silicon dioxide containing layer disposed above the silicon substrate, and a plurality of cavities formed in the silicon substrate through the silicon dioxide containing layer. The cavities have hydrophobic sidewalls. The method also includes exposing the silica stain test structure to deionized water, and drying the silica stain test structure to form the silica stain on the silicon dioxide containing layer.

In another embodiment, the invention relates to a silica stain test structure for facilitating the formation of silica stain. The silica stain test structure includes a silicon substrate, a silicon dioxide containing layer disposed above the silicon substrate. The silicon dioxide containing layer is preferably hydrophilic. The silica stain test structure further includes a plurality of cavities formed in the silicon substrate through the silicon dioxide containing layer. The cavities preferably have hydrophobic sidewalls.

In yet another embodiment, the invention relates to a method for creating a silica stain test structure. The silica stain test structure is configured for use in monitoring silica stains formed during integrated circuit manufacture. The method includes providing a silicon substrate, and depositing a silicon dioxide containing layer above the silicon substrate. The silicon dioxide containing layer is preferably hydrophilic. The method further includes etching a plurality of cavities in the silicon substrate through the silicon dioxide containing layer. The method also includes etching the silica stain test structure with an HF etchant, thereby rendering sidewalls of the cavities hydrophobic.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention will now be described in detail with reference to a few illustrative embodiments thereof as provided in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one embodiment of the present invention, there is provided an inventive silica stain forming technique that advantageously increases the amount of silica dissolved during the washing step. By increasing the amount of hydrated silica, the resulting silica stain that is left on the test structure after drying is advantageously larger and/or thicker and therefore more susceptible to visual monitoring using conventional optical monitoring techniques (e.g., using conventional 10X–100X optical microscopes).

In accordance with this embodiment, an inventive silica stain test structure having a high surface area for silica dissolution is provided. In contrast with prior art planar silica stain test structures, the inventive silica stain test structure employs the large sidewall surface areas of cavities (e.g., holes or trenches), which are formed into the silicon substrate, to increase the silicon dissolution. The large sidewall surface areas of these cavities ensure that large amounts of silicon are dissolved during the washing step, therefore yielding larger stains after the test structure is dried.

In accordance with one aspect of the present invention, the silicon sidewall surface areas of the cavities are rendered hydrophobic (e.g., by etching the test structure with an HF etchant). The top surface area of the test structure is, however, allowed to remain hydrophilic (e.g., by maintaining a coating of silicon dioxide thereon). During washing, deionized water is retained inside the cavities by capillary force to increase silica dissolution. During drying, however, the hydrophilic top surface area of the test structure allows more of the hydrated silica solution to remain on the top surface area. Upon drying, a larger and/or thicker stain results.

Figure 1:
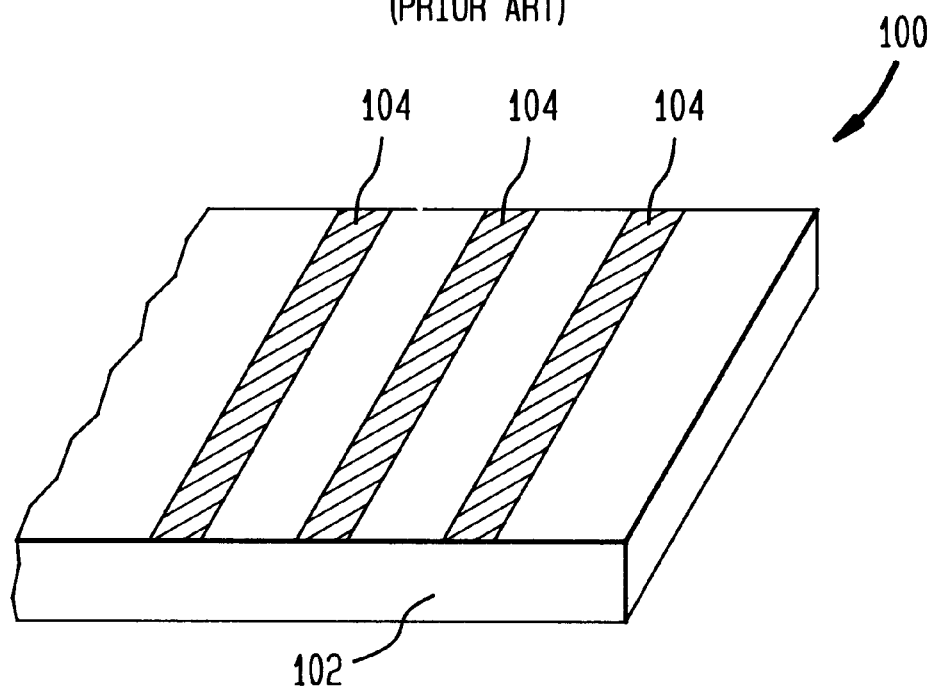
FIG. 1 illustrates a prior art planar silicon stain test structure.
Figure 2:
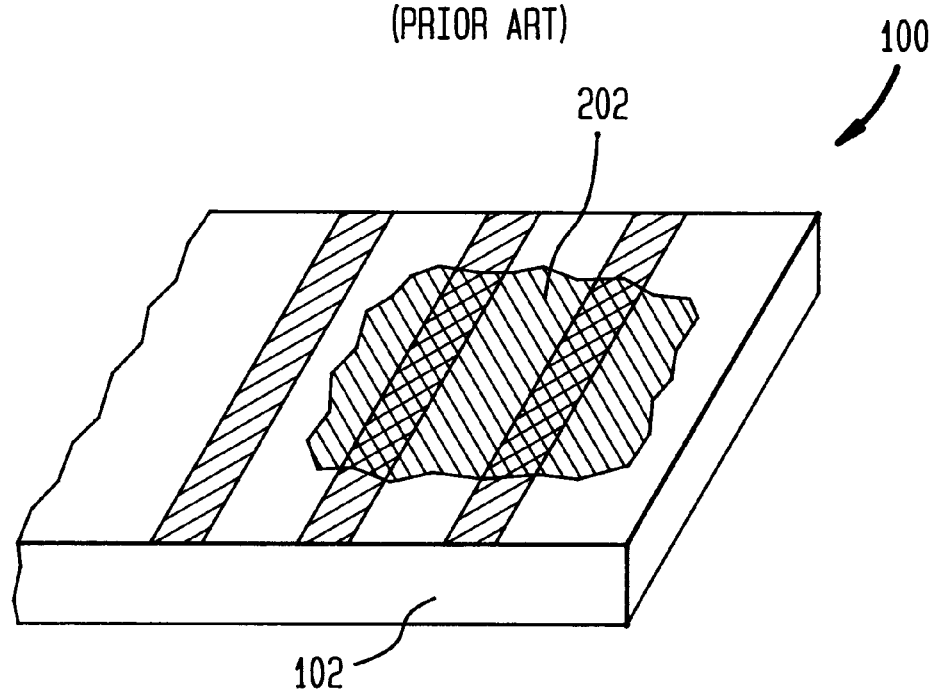
FIG. 2 illustrates a stain formed on the prior art silicon stain test structure of FIG. 1.
Figure 3:
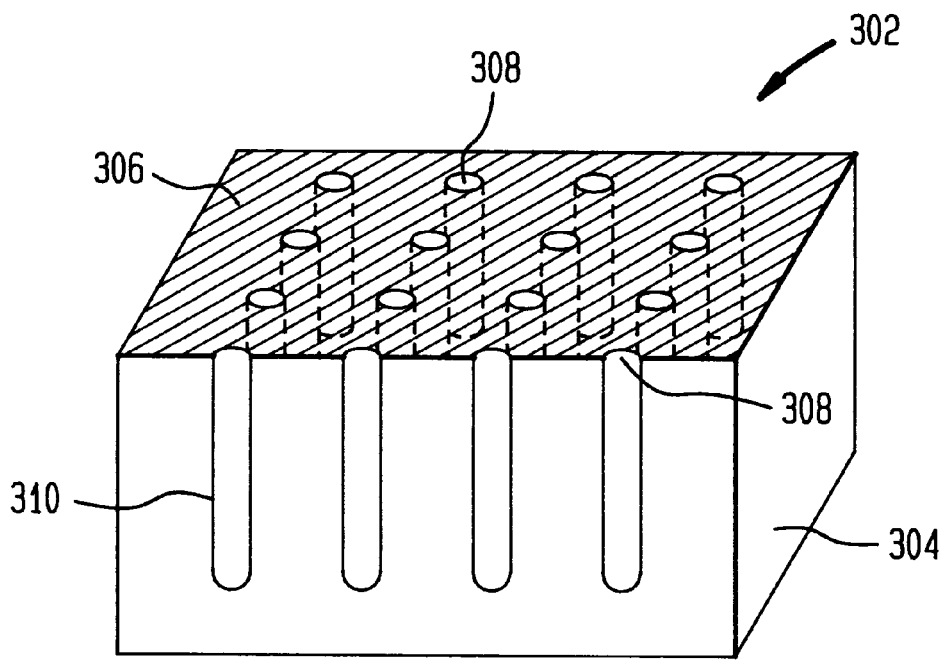
FIG. 3 depicts, in accordance with one embodiment of the present invention, a portion of the inventive silica stain test structure.

The features and advantages of the present invention may be better understood with reference to FIG. 3. In FIG. 3, a portion of the inventive silica stain test structure 302 is shown. Silica stain test structure 302 is typically formed of a silicon substrate 304. Above silicon substrate 304, there is disposed a stainable layer 306. The stainable layer 306 is sufficiently hydrophilic after an H-F etch to effectively cause slica stains to form thereon. The Stainable layer 306, in one embodiment, comprises a dielectric material. Such dielectric material includes, for example, silicon dioxide ($SiO_2$) such as TEOS or other silicon containing oxide layers. Silicon dioxide containing layer 306 may be deposited using any conventional deposition technique, including chemical vapor deposition (CVD) or low pressure chemical vapor deposition (LPCVD). Other layers comprising, for example, nitride or oxynitride are also useful.

A plurality of cavities 308 are formed in silicon substrate 304 through silicon dioxide containing layer 306. Although cavities 308 are shown as holes in this example, they may be trenches in other cases. As mentioned, the sidewall surfaces 310 of cavities 308 represent the primary silicon dissolution sites, and the amount of stain formed is typically proportional to the sidewall surface area, all things being equal.

In one embodiment, cavities 308 may be etched by Reactive Ion Etching (RIE). Cavities 308 may, however, be formed by any conventional etching method using an appropriate etchant chemical and an appropriate photoresist technique. One such photoresist technique involves the patterning of the photoresist layer by depositing the photoresist material above silicon dioxide containing layer 306, exposing the photoresist material in a contact or stepper lithography system, and developing the photoresist material to form a mask to facilitate subsequent etching.

After cavities 308 are formed, the sidewalls 310 of cavities 308 are etched with an HF etchant to render the sidewall surface 310 hydrophobic. It is believed that such etching results in the removal of the native oxide layer from the sidewall surface 310 and the formation of dangling hydrogen atoms on the sidewall surface 310. Because of this, the sidewall surface 310 changes from being hydrophilic to hydrophobic.

Figure 4:
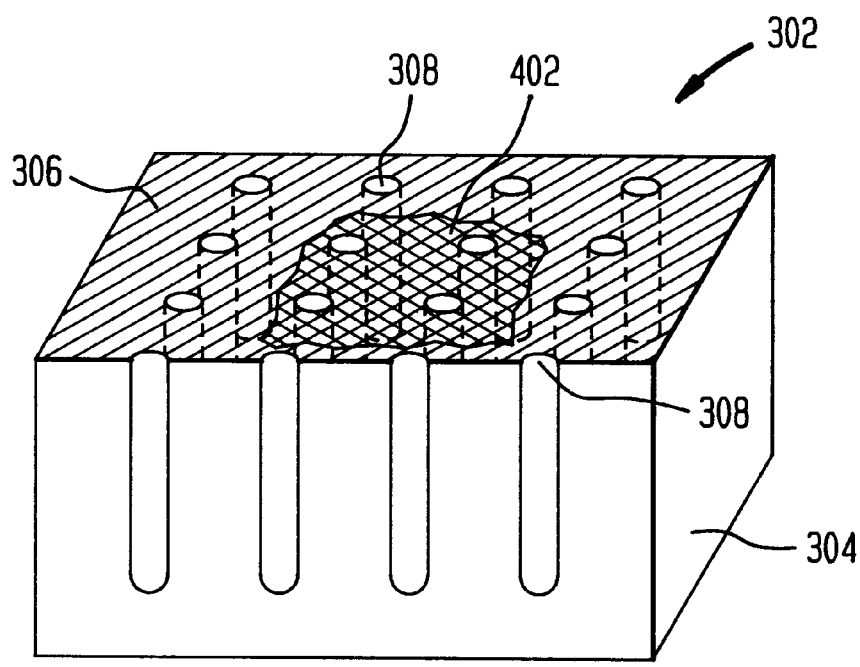
FIG. 4 illustrates, in accordance with one embodiment of the present invention, a stain formed on the inventive silicon stain test structure of FIG. 3.

Silicon dioxide containing layer 306 preferably has a thickness sufficient to permit some hydrophilic silicon dioxide to remain on the surface of silica stain test structure 302 after HF etching. The rough hydrophilic silicon dioxide surface improves retention of the dissolved silica solution, resulting in silica stains that are thicker and/or larger after drying. An exemplary silica stain is shown in FIG. 4 as silica stain 402.

Figure 5:
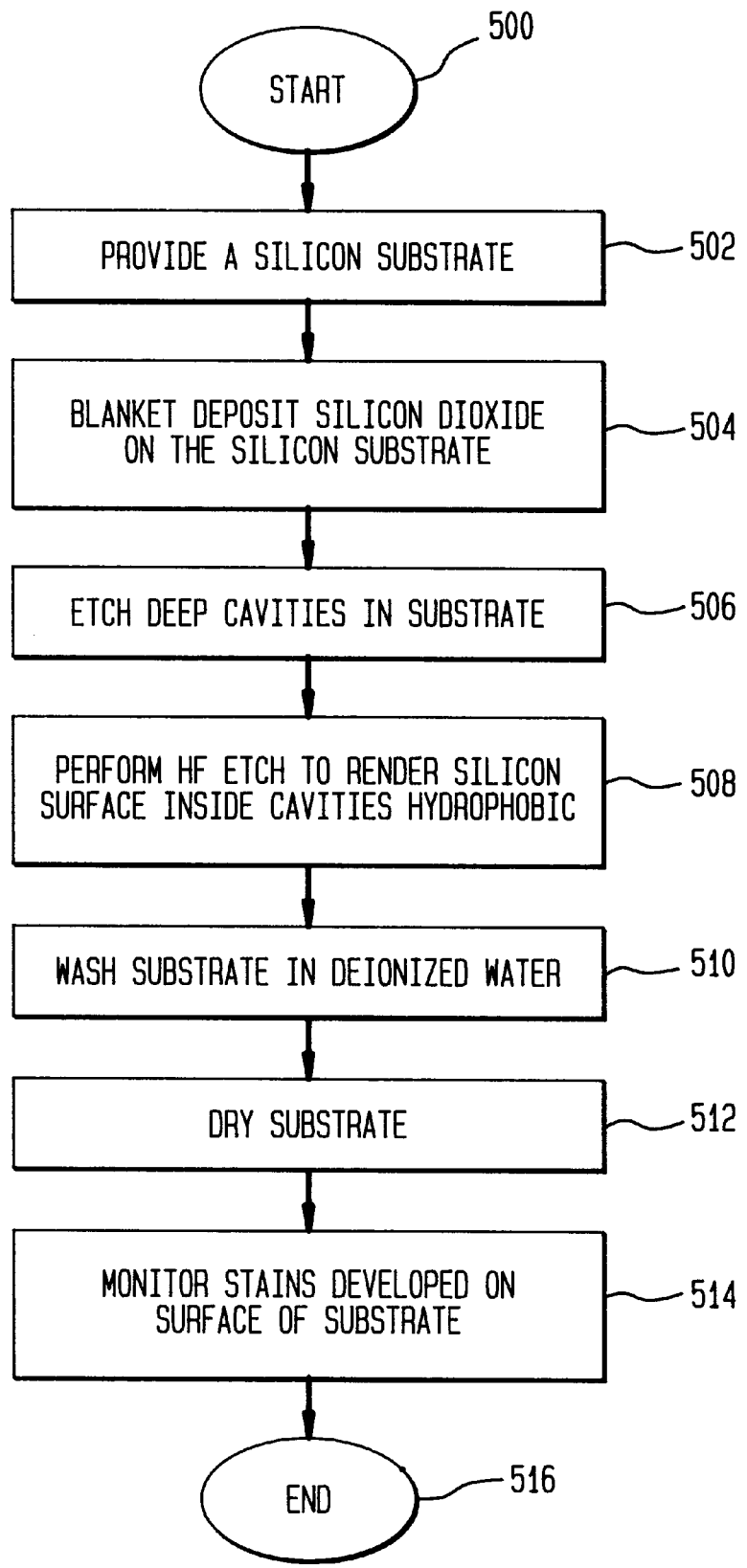
FIG. 5 is a flow chart depicting the steps involved in forming and using the inventive silica stain test structure to detect and/or monitor silica stains.

FIG. 5 is a flow chart depicting the steps involved in forming and using the inventive silica stain test structure to detect and/or monitor silica stain. In step 502, a silicon substrate, e.g., a silicon wafer, is provided. The silicon substrate may be a dedicated substrate or a portion of a production substrate, e.g., a substrate employed to form dynamic random access memory (DRAM) or any other semiconductor device. In step 504, a hydrophilic silicon dioxide ($SiO_2$) containing layer is blanket deposited above the silicon substrate. As mentioned, the silicon dioxide containing layer is preferably sufficiently thick to allow some hydrophilic silicon dioxide to remain after HF etching. In one embodiment, a silicon-dioxide containing layer about 3,500 angstroms thick is suitable.

In step 506, a plurality of cavities (e.g., holes or trenches) are etched into the silicon substrate through the silicon dioxide containing layer. As mentioned earlier, the cavities are preferably dimensioned so as to furnish a large surface area for silica dissolution while permitting the capillary force within the cavities to retain deionized water during washing and at the start of the drying process (thereby increasing silica dissolution).

In step 508, the sidewall surface of the cavities are etched with an HF etchant. In one embodiment, a solution of HF in $H_2O$ having concentration of about 0.001% to about 1% is employed to perform the wet HF etch. Preferably, an aqueous solution of 0.05% is employed to wet etch the sidewall surface for about 1–2 minutes. The concentration of the HF solution and the duration of the etch are such that the sidewall surfaces turn hydrophobic but the layer of hydrophilic silicon dioxide containing layer preferably remains on the surface of the silica stain test structure.

Note that the HF etch does not necessarily have to be a wet etch. Other etching techniques (e.g., plasma etching) are also useful. Further, other etchants that turn the sidewalls hydrophobic are also useful. Such etchants include, for example, caustic chemicals such as KOH.

In step 510, the substrate is washed in an deionized water solution. The water enters the cavities and is held therein by the capillary action within the cavities. While in the cavities, water dissolves the silica at the sidewall surface. Exemplary duration of the washing step may be anywhere between 1 minute and 2 hour, with about 10 minutes being one example that works well.

In step 512, the silica stain test structure is dried to remove the deionized water, thereby forming the stains. Drying may be accomplished in any conventional manner, including the use of low pressure, elevated temperature, spinning, alcohol, liquid or vapor immersion, and/or the like. Surprisingly, during the drying and/or washing process, the silica-containing solution gets drawn to the surface from within the high aspect ratio cavities. This is contrary to the expectation that the capillary action within the high aspect ratio cavities would continue to retain the silica-containing solution therein during drying and/or washing, which results in a smaller and/or thinner stain. In reality, the opposite effect is observed as the silica stain that is formed is much thicker and/or larger than that associated with prior art planar silica stain test structures.

While not wishing to be bound by theory, it is believed that the capillary force holding the solution in the cavity is reversed once the cavity opening is uncovered during the drying process. This allows the silica-laden aqueous solution to be drawn to the surface, where it dries and forms stains.

At any rate, it is observed that the silica stain found on the surface is typically sufficiently large and/or thick to allow observation using a conventional optical microscope having a power of about 10X to about 100X. The silica stain may also be readily measured using conventional thickness measurement techniques (e.g., SEM photographs, contact measurement techniques, and the like). Since the stains that are formed are thicker and/or larger, the resulting stains also improve the accuracy of automated stain detection techniques, which may be employed by some manufacturers to automatically quantify the amount of stain on the surface of a substrate.

It is important that the cavities be properly sized to allow the surface tension therein to retain the deionized water, thereby permitting the silica to be dissolved despite the hydrophobic nature of the cavities' sidewalls. Further, the cavities should be properly spaced apart from each other to maximize silica stain formation. In one embodiment, the cavities have an aspect ratio that is sufficient to permit deionized water to remain in the cavities to dissolve silica therein. The aspect ratio, for example, is $\geq$ about 20:1 (i.e., the cavities are at least 20 times deeper than they are wide). The critical dimension, i.e., the width of the cavities, may be smaller than about 0.5 microns. The spacing between adjacent cavities may be less than about 0.5 microns.

In one embodiment, the aspect ratio of the cavities is between 20:1 to about 500:1, preferably between about 20:1 to about 80:1, and more preferably about 40:1. The critical dimension may be between 0.05 microns and about 0.5 microns, more preferably between about 0.175 microns and about 0.5 microns, and preferably at about 0.25 microns. The spacing between adjacent cavities may be between 0.05 microns to about 0.5 microns, more preferably between 0.2 microns and about 0.5 microns, and preferably at about 0.3 microns. Within these ranges, it is expected that the inventive silica stain test structure yields stains that are larger and/or thicker (hence more readily observable) than stains formed using prior art substantially planar silica stain test structures. Since the stains formed using the inventive silica stain monitoring technique do not require any additional processing before they can be observed and/or measured, savings in time and costs may be realized.

In accordance with one aspect of the present invention, the silica stain test structure may reside on its own wafer, which may be processed periodically between groups of production wafers (e.g., wafers employed to fabricate DRAMs or other semiconductor devices) to monitor the consistency of a given process (with regard to stain formation). Since the formation and monitoring of silica stain does not involve additional processing (e.g., the above-mentioned RIE etching as is done in the prior art to render the stain observable) or any other destructive step, the inventive silica stain test structure may be cleaned and re-used over and over, thereby saving costs.

Alternatively, the inventive silica stain test structure may be fabricated on a portion of the production wafer (e.g., wafers employed to fabricate DRAMs or other semiconductor devices) to permit production engineers to monitor the amount of silica stain present on a given wafer after washing and drying. This arrangement is highly advantageous since the cavities may be formed using the same VLSI fabrication techniques employed to form the semiconductor devices (e.g., DRAMs).

While this invention has been described in terms of several illustrative embodiments, there are alterations, permutations, and equivalents which fall within the scope of this invention. It is therefore intended that the following appended claims be interpreted as including all such alterations, permutations, and equivalents as fall within the true spirit and scope of the present invention.

What is claimed is:

1. A method for forming silica stain on a substrate to facilitate monitoring of said silica stain during integrated circuit manufacture, comprising:

providing a silica stain test structure, including:
      a silicon substrate;
      a hydrophilic silicon dioxide containing layer disposed above said silicon substrate; and
      a plurality of cavities formed in said silicon substrate through
      said silicon dioxide containing layer, said cavities having hydrophobic sidewalls;
   exposing said silica stain test structure to deionized water; and
   drying said silica stain test structure to form said silica stain on said silicon dioxide containing layer.

2. The method of claim 1 wherein at least some of said cavities represent holes in said silicon substrate through said silicon dioxide containing layer.

3. The method of claim 1 wherein at least some of said cavities represent trenches in said silicon substrate through said silicon dioxide containing layer.

4. The method of claim 1 wherein at least some of said cavities have an aspect ratio of greater than about 20:1.

5. The method of claim 1 wherein at least some of said cavities have an aspect ratio of greater than about 80:1.

6. The method of claim 1 wherein at least some of said cavities have an aspect ratio of about 40:1.

7. The method of claim 1 wherein at least some of said cavities have a critical dimension of less than 0.5 microns.

8. The method of claim 1 wherein at least some of said cavities have a critical dimension of about 0.25 microns.

9. The method of claim 1 wherein at least some adjacent ones of said cavities are spaced less than 0.5 microns apart.

10. The method of claim 1 wherein said integrated circuit manufacture includes dynamic random access memory (DRAM) manufacture.

11. The method of claim 10 wherein said silicon substrate represents a portion of a substrate employed to fabricate said dynamic random access memory (DRAM).

12. A method for creating a silica stain test structure, said silica stain test structure being configured for use in monitoring silica stains formed during integrated circuit manufacture, comprising:

provding a silicon substrate;

depositing a silicon dioxide containing layer above said silicon substrate, said silicon dioxide containing layer being hydrophilic;

etching a plurality of cavities in said silicon substrate through said silicon dioxide containing layer; and etching said silica stain test structure with an HF etchant, thereby rendering sidewalls of said cavities hydrophobic.

13. The method of claim 12 wherein said silicon dioxide containing layer is of a sufficient thickness to permit at least some silicon dioxide to remain above said silicon substrate after said etching with said HF etchant.

14. The method of claim 12 wherein said silica stain test structure is employed during dynamic random access memory (DRAM) manufacture.

* * * * *